United States Patent [19]
Ayres et al.

[11] Patent Number: 5,686,832
[45] Date of Patent: Nov. 11, 1997

[54] MINIATURE CROSSED COIL GAUGE HAVING AN ACTIVE FLUX RING

[75] Inventors: John A. Ayres, Lapeer; David L. Ehle, Attica, both of Mich.; Michael E. Salmon, Madison, Ala.; Craig A. Ayres, Lapeer, Mich.

[73] Assignee: Nu-Tech & Engineering, Inc., Lapeer, Mich.

[21] Appl. No.: 548,584

[22] Filed: Oct. 26, 1995

Related U.S. Application Data

[63] Continuation-in-part of Ser. No. 538,378, Oct. 3, 1995, abandoned, and a continuation-in-part of Ser. No. 61,954, May 17, 1993, abandoned.

[51] Int. Cl.$^6$ ............................ G01R 5/16; G01R 1/14; G01R 1/16; G01R 1/38
[52] U.S. Cl. ............................ 324/146; 324/144
[58] Field of Search ............................ 324/140 R, 143, 324/144, 146, 151–155; 335/222

[56] References Cited

U.S. PATENT DOCUMENTS

| | | | |
|---|---|---|---|
| 2,486,972 | 11/1949 | Osterlund et al. | 324/146 X |
| 2,978,639 | 4/1961 | Lawson | 324/146 |
| 3,621,418 | 11/1971 | Baker | 324/146 X |
| 3,995,214 | 11/1976 | Dionne | 324/146 |
| 4,047,136 | 9/1977 | Satto | 324/146 X |
| 4,123,675 | 10/1978 | Moskowitz et al. | |
| 4,492,920 | 1/1985 | Reenstra | 324/146 |
| 4,584,495 | 4/1986 | Kordik | |
| 4,646,007 | 2/1987 | Faria | 324/146 |
| 4,673,997 | 6/1987 | Gowda et al. | |
| 4,724,601 | 2/1988 | Macmanus et al. | 324/146 X |
| 4,758,784 | 7/1988 | Baker et al. | 324/146 |
| 4,760,333 | 7/1988 | Ichimura et al. | 324/143 |
| 4,831,293 | 5/1989 | Krop | 324/146 X |
| 4,882,659 | 11/1989 | Gloudemans | |
| 5,017,862 | 5/1991 | Brooks | 324/144 X |
| 5,061,893 | 10/1991 | Gutmann | 324/154 PB |

FOREIGN PATENT DOCUMENTS

| 2048118 | 1/1992 | Canada | 324/146 |
|---|---|---|---|

*Primary Examiner*—Gerard R. Strecker
*Attorney, Agent, or Firm*—Brooks & Kushman P.C.

[57] ABSTRACT

A miniature crossed coil gauge is provided having an oriented rare earth magnet fixedly mounted on a rotary shaft for supplying a magnetic flux directed transverse to the shaft axis. The gauge housing provided by an upper and lower bobbin surrounds the magnet and supports the rotary shaft. A first and second coil are wound about the gauge housing in a crossed coil orientation encircling the magnet. A flux ring is disposed around the first and second coils axially aligned with respect to the magnet. The magnet has sufficient strength and the flux ring is mounted in sufficiently close proximity to the first and second coils to redistribute the flux supplied by the magnet so that the magnetic flux measured at the surface of the coils is substantially increased relative to the magnetic flux density measured with the flux ring removed. This gauge construction facilitates the fabrication of gauges so small that they can be directly mounted on printed circuit boards using conventional electronic component mounting equipment.

14 Claims, 13 Drawing Sheets

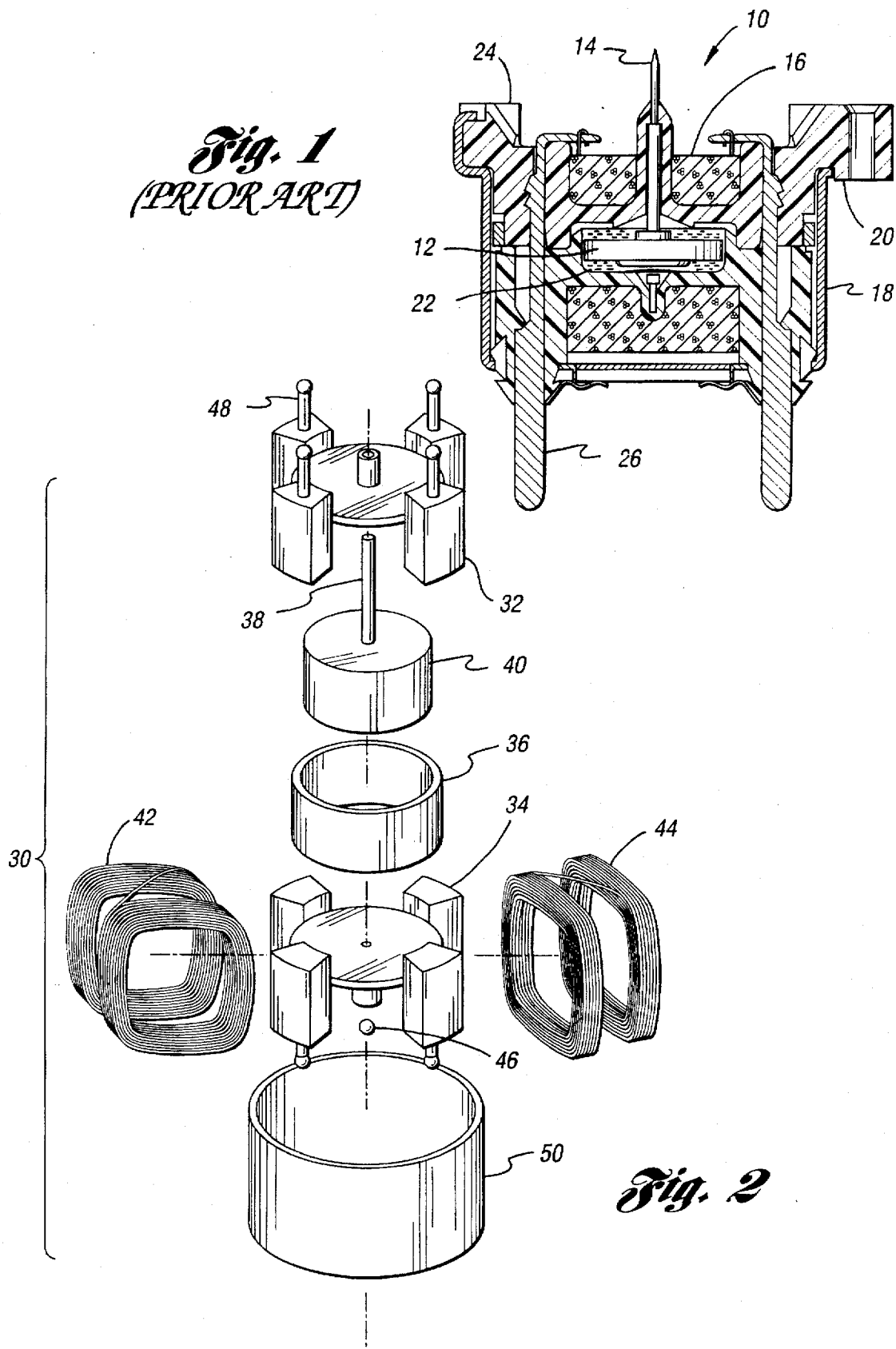

5,686,832

MINIATURE CROSSED COIL GAUGE HAVING AN ACTIVE FLUX RING

RELATED CASES

This application is a continuation-in-part of the commonly owned, file wrapper continuation Ser. No. 08/538,378, filed Oct. 3, 1995, abandoned, of Ser. No. 08/061,954, filed May 17, 1993, abandoned, entitled "MINIATURE AIR CORE GAUGE".

TECHNICAL FIELD

The field of the invention relates to an improved micro miniature analog meter movement for an air core crossed coil type gauge.

BACKGROUND OF THE INVENTION

Analog instrumentation remains the most widely used and preferred method of displaying automobile data to the driver. This is due to their simple function and ability to be adapted to many different styles. Even expensive automobile models that essentially have an unlimited instrumentation budget commonly choose analog gauges. Future requirements for instruments will unquestionably include analog gauges. A need is seen for new technology to help control the rising costs of instrument clusters by enabling a simpler more flexible instrument cluster design concept.

Most current production automotive analog gauges utilize either air core, D'arsonval, or bi-metal gauge technology.

One main problem with current air core gauges is their size and bulk. Mechanical complexity in the instrument housing, face plate and connections are required to mount and constrain the gauge mechanisms. The instrument housing has evolved into a very complex part that requires tooling with long lead times and high cost. This high tooling cost is further magnified when "late changes" are required after the design is released for production. Automation of the assembly process requires specially designed equipment for each type of instrument cluster produced. The continual capital investment in this manufacturing equipment each time a new model is introduced drives the instrumentation costs even higher.

The new micro-miniature gauge of the present invention does not require the complex mounting methods and housing complexity that today's larger gauges need. The new gauge is directly mounted to the printed circuit board which becomes the support structure for the entire instrument cluster.

The new micro-miniature gauge becomes an enabling technology for flexible instrument cluster designs, miniature telltale modules, and analog projection HUDs (heads up display).

Air-Core or Cross-Coil gauges have been used in automotive instruments since they were first invented in 1965 (see U.S. Pat. No. 3,168,689). As shown in FIG. 1, a prior art crossed coil gauge 10 as shown utilizes a two pole radially charged cylindrical magnet 12 attached to a coaxial shaft 14. The magnet rotates with the shaft in response to a resultant magnetic flux vector. This flux vector is generated by two coils 16 wound one over the other encircling the magnet. The coils are "air-core", i.e., they contain no iron, and the first coil axis is perpendicular to the second coil. The coils are surrounded by an iron ring or an iron can 18 to provide shielding from other external magnetic fields. The magnet is housed in a plastic bobbin 20 that serves as bearing, damping fluid container, coil bobbin, iron can holder and gauge mounting means. Silicone damping fluid 22 fills the fluid container cavity formed in the bobbin and restrains magnet rotation. Gauge 10 has a flat upper mounting surface 24 and a series of electrical terminals 26 on the opposite surface.

Over the years several refinements have been proposed for aircore gauges. Most recently, U.S. Pat. No. 4,760,333 shows a novel way to provide a magnetic shield utilizing a wound strip of amorphous metal alloy. This replaces the conventional iron can or ring to provide magnetic shielding. U.S. Pat. No. 4,827,210 shows a modification to the plastic bobbin to facilitate equal coil winding lengths to produce a more linear gauge. U.S. Pat. No. 4,992,726 shows woven (interlaced) coil windings to produce a more linear gauge. U.S. Pat. No. 5,017,862 shows improved bearing design and bobbin structure. U.S. Pat. No. 5,038,099 teaches a radial air-core gauge design that balances the coil windings and produces a thinner gauge. U.S. Pat. No. 5,095,266 shows a method of containing viscous damping fluid for more uniform damping of the gauge.

Even though many incremental improvements have been shown in the literature, several problems remain with current production air-core gauges. The first problem is size. Most air core gauges are from ¾ to 1¼ inches in diameter and ½ to 1 inch long. They typically require complex mounting methods involving various screws, clips and plastic molded parts. Special machines and processes are often designed to assemble the gauges into instrument clusters. The gauge thickness can control the minimum thickness of the instrument cluster and a larger gauge diameter makes backlighting the instrument dials difficult. Complex plastic light pipes are often used to light gauge dials and pointers to bring light from behind and around to the front of the gauge. Automated gauge assembly directly to electronic circuit board assemblies is desirable but difficult with current large air-core gauge designs.

A second unresolved problem involves the use of a liquid damping fluid in the air-core gauge. This is most commonly a silicon fluid of the appropriate viscosity. A messy production process is required to deposit the fluid inside the gauge bobbin assembly. Migration of the fluid often occurs while the gauge is being transferred or stored or in actual use, resulting in lesser or sometimes no damping of the gauge after a period of usage. Various attempts have been made to eliminate problems with viscous fluid damping. U.S. Pat. No. 5,095,266 shows a recent attempt.

Magnetic eddy current damping has been used in devices other than air-core gauges to eliminate a viscous fluid. One of the most common devices utilizing eddy current damping is a watt-hour meter used by electrical utilities. The use of eddy current damping in these devices is described in U.S. Pat. Nos. 4,238,729 and 4,238,730. The eddy current damping provides a continuous drag torque on a rotating electrically conductive disk or cylinder which balances the disk drive torque providing a disk speed proportional to the rate of power consumption. It is generally not used as a transient torque vibration damper in this application. U.S. Pat. No. 3,786,685 shows a copper cup-shaped ring that rotates in a magnetic field to dampen transient motion in a gyro. U.S. Pat. No. 3,983,478 discloses a moving coil instrument with copper rings for eddy current damping. These rings are welded to the moving coil and cut through a magnetic field to slow their rate of rotation. These eddy current damping devices all depend on high magnetic flux densities generated by using small air gaps and flux concentrating iron pole pieces or multiple magnets. They are generally bulky and heavy because of the high flux requirements for damping.

It has been observed that all current production air core gauges utilize the iron can or ring to provide magnetic shielding. Because of the design geometry and the magnets used, the can has little effect on the flux linking the gauge coils. Thus, the iron can or ring has little effect on the gauge torque which is primarily limited by the magnet materials, the gauge geometry and the number of amp-turns produced by the coil windings.

Air-core gauges have been used in various "telltale" designs to rotate icon masks in front of a light to indicate a failure in one of a number of automotive systems (see U.S. Pat. No. 3,660,814). In these applications a problem exists that no detente action is provided in the gauge to "hold" a position. Therefore, continuous power is generally required. A need exists to provide a method of modifying the magnetic reluctance of the air core gauge to provide unique torque characteristics in the gauge for detente action or to linearize the gauge.

In summary, several current air-core gauge problems have been identified. These problems are: a.) large gauge size; b.) unreliable liquid damping; c.) inefficient magnetic flux utilization; and d.) constant magnetic reluctance.

SUMMARY OF THE INVENTION

An object of the present invention is to provide a novel miniature air core gauge that can be assembled to an electronic circuit substrate as though it were a standard electronic component. Using this new enabling technology, a flexible circuit board assembly process can be used to manufacture a variety of automotive instrument clusters utilizing commonly available circuit board equipment with high flexibility.

It is an object of the invention to reduce the size of the gauge to as small as possible to enable assembly of the gauge to electronic circuit boards by common electronic component assembly equipment.

It is a further object to assemble the gauge by electrical connections from either end of the gauge.

Another object of the invention is to utilize magnetic damping or ferrofluids replacing the conventional silicon fluid viscous damping means.

Still another object of the invention is to provide means for greatly increased flux utilization to both increase gauge torque and make magnetic damping possible.

Finally, another object of the invention is to make a variable reluctance flux ring to enable gauge torque variation as a function of magnet angular position to linearize the gauge or make stepping action of the gauge possible.

It has been discovered that prior art air-core gauges use large diameter ceramic or ALNICO magnets. A few use unoriented plastic molded rare earth magnets but are more costly. It has also been discovered that in these prior art gauges the amount of magnet flux threading the coils is not significantly increased by the addition of the iron can. In these applications the flux ring or flux can serves primarily as a magnetic shield to prevent external fields from affecting gauge accuracy.

In the present invention, the combination of a small diameter flux ring of sufficient thickness will significantly affect the available magnet flux to the coils when used with high strength magnets. It has been determined that such a flux ring will cause the magnet flux to redistribute from the magnet poles in such a manner as to significantly increase the magnet flux encircling the gauge coils. This works especially well with the very high strength sintered neodymium magnets. The total magnetic flux of the magnet remains relatively constant while its flux is redistributed by the flux ring. Thus, with the combination of a small diameter flux ring and high strength orientated neodymium magnet the ring becomes not only a magnetic shield but also a significant influence on the flux available around the coils. In the present invention, high flux levels boost torque and provide the intensity necessary to make direct magnetic damping possible.

Further objects are implicit in the detailed description which follows hereinafter (which is to be considered as exemplary of, but not specifically limiting, the present invention) and said objects will be apparent to persons skilled in the art after a careful study of the detailed description which follows.

For the purpose of clarifying the nature of the present invention, one exemplary embodiment of the invention is illustrated in the hereinbelow-described figures of the accompanying drawings and is described in detail hereinafter. It is to be taken as representative of the multiple embodiments of the invention which lie within the scope of the invention.

Accordingly, a crossed coil gauge as provided is a rotatable shaft oriented along a gauge shaft axis. Affixed to the shaft is a rare earth magnet for generating magnetic flux transverse to the shaft axis. The magnet is generally cylindrically shaped and has a radius which is about 1.4 or less than the magnet axial length. A gauge housing is provided by an upper and lower bobbin disposed around the magnet and pivotally supporting the shaft. A first and second coil is wound around the gauge housing with the first coil wound generally perpendicular to the second coil and the first and second coils encircle the magnet in a crossed coil manner. A flux ring is disposed around the first and second coils and axial aligned with the magnet and shaft. The magnet has sufficiently high strength and the flux ring being mounted in a sufficiently close proximity to the first and second coils to distribute the magnetic flux applied by the magnet to actively increase gauge performance. The magnetic flux density nearer the first and second coil surface being substantially increased when the flux ring is present in comparison to the magnetic flux measured with the flux ring off.

In a preferred embodiment of the invention, a damping ring is provided to generate eddy current damping for limiting magnet and shaft oscillations. The damping ring is a generally cylindrical non-ferrous electrically conductive member positioned within the gauge housing between the upper and lower bobbins spaced from and surrounding the magnet. The damping ring is fixed relative to the housing and encircled by the first and second coils.

In a preferred embodiment of the invention, the flux ring is formed of a mixture of iron and nickel utilizing a powder metal process to achieve a thick cross-section part of very concentric and round geometry.

BRIEF DESCRIPTION OF THE DRAWINGS

FIG. 1 is a cross sectional view of a prior art air core gauge;

FIG. 2 is a perspective view showing an exemplary first embodiment of one representative form of the invention;

FIG. 5a is a graph illustrating uncompensated gauge error as a function of gauge angle for a circular flux ring illustrated in FIG. 4a;

DETAILED DESCRIPTION OF THE INVENTION

Figure 3:
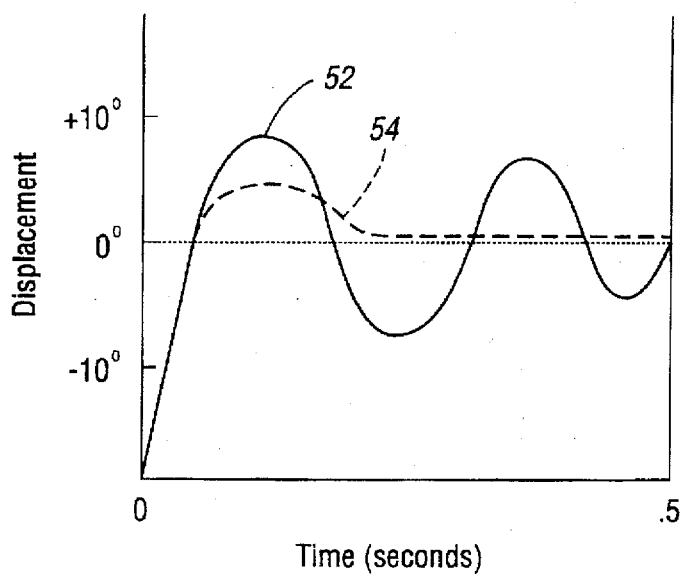
FIG. 3 is a graph showing the step response in gauge position with magnetic damping versus no damping for the first embodiment of the invention.

Referring to FIG. 2, an exploded view of the major components of the miniature crossed coil gauge 30 is shown. The gauge housing is formed of three pieces; the upper bobbin 32, lower bobbin 34, and damping ring 36. These three pieces fit together to form a bearing support and closed cavity to house the shaft 38 and magnet 40 assembly. This assembly also provides support for first coil 42 and second coil 44. Bearing 46 is pressed into lower bobbin 34 to provide a thrust bearing 46 for shaft 38. Damping ring 36 is made of copper and provides a unique method of damping the gauge to remove oscillations in the rotation of the magnet 40 and any externally connected pointers. Damping ring 36 can optionally be made from aluminum. The flux from magnet 40 passes perpendicular to the circumference of damping ring 36 and relative motion between magnet 40 and damping ring 36 induces an eddy current in the damping ring 36 that provides eddy current generated damping. This method replaces the conventional silicon damping fluid generally used in air core gauges.

Terminal pins 48 are molded or inserted into upper bobbin 32 and lower bobbin 34 to provide front or rear mounting of the gauge to a printed circuit board. Terminal pins 48 may also be shaped for surface mounting the gauge to circuit board assemblies.

Flux ring 50 provides a closed flux return path for magnet 40 and first coil 42 and second coil It has been found in this configuration that the magnet flux density near the magnet poles at the coils can be approximately doubled by the addition of the flux ring 50. Flux ring 50 also provides shielding from external magnetic fields to keep other devices from interfering with the gauge. Magnet 40 in this design is a rare earth type magnet and can be non oriented or a high performance oriented magnet. More effective eddy current damping can be achieved by using a higher flux density magnet 40 that has an outwardly directed flux pattern.

Flux ring 50 can be made from low carbon steel but it is preferred to use a nickel alloy steel. It is important when using a higher strength magnet 50 to have sufficient flux ring 50 thickness to avoid magnetically saturating flux ring 50 material and thus limiting gauge performance.

The following table provides a comparison of various characteristics of the first embodiment of the invention versus a prior art air-core gauge.

TABLE 1

Air-Core Gauge Comparisons

|  | First Embodiment Mini-Gauge | Preferred Range | Prior Art Standard Gauge |
| --- | --- | --- | --- |
| Gauge Outside Diameter | .540 inch | .3–.6 | 1.005 inch |
| Gauge Overall Height | .400 inch | .3–.6 | .720 inch |
| Maximum Torque* | 2.00 g-cm. | >1.5 | 1.25 g-cm. |
| Magnet Type | Sintered-oriented Neodymium | Dense Rare Earth | Plastic Molded Neodymium |
| Magnet Volume | .0088 in³ | <.01 in³ | .026 in³ |
| Magnet Diameter | .250 inch | .15–.35 | .530 inch |
| Magnet Radius | 0.125 inch | .075–.175 | 0.265 inch |
| Magnet Length | 0.179 | .35–.74 times the diameter | 0.118 inch |
| Peak Flux Density @ Magnet Surface | 5.14 Kilogauss | >4.0 Kilogauss | 2.15 Kilogauss |
| Peak Flux Density @ Flux Ring | 1.58 Kilogauss | >1.0 Kilogauss | 450 gauss |
| Peak Flux Density @ Flux Ring (w/o ring) | 948 gauss | <75% of Flux w/ring | 380 gauss |
| Percentage Change in Peak Flux Density Caused by Ring | 67% | >30% | 18% |

*The maximum gauge torques are compared at equal coil amp-turns to compare magnetic performance of the gauges.

It can be seen from this data that the mini-gauge is much smaller than the prior art. It is about one-half the diameter and about one-half as long as the prior art. Yet, on an equal amp-turn basis the magnetics of the mini-gauge produces an output torque that is 60% higher than prior art. The prior art gauge chosen for comparison uses a state-of-the-art molded neodymium-iron magnet that produces a relatively high flux level when compared to other prior art air-core gauges that use either ceramic or alnico magnets. Therefore, other prior art aircore gauges would show yet lower torque performance when compared to the subject invention. The magnet volume of the mini gauge is only ⅓ of the prior art. Because of the small size, the more expensive sintered-oriented neodymium iron magnet can be utilized in the mini gauge but becomes cost prohibitive to use in the prior art gauge. Even though the torque of the mini gauge is higher than the prior art the magnet is only ½ the diameter. The mini gauge has 2.4 times the flux level on the magnet surface compared to prior art. The peak flux density into the flux ring is 3.5 times the prior art. The peak flux density near the coils without the flux ring is reduced to 948 gauss in the mini gauge and 380 gauss in the prior art gauge. Comparing the percentage change in peak flux density caused by the flux ring shows that the mini gauge gets a much larger boost in available coil flux by the addition of the flux ring when compared to prior art (67% versus 18%).

Thus, the flux ring of the present invention becomes more than just a shield and plays a more important role in the magnetic circuit of the gauge and thus it's performance. The combination of compact size and high powered magnet gives a result much different than prior art air-core gauges and it's potential is not obvious without detailed analysis of the magnetic materials and geometry involved.

The higher flux level attained at the coils in the mini gauge was found to be primarily caused by the redistribution of the magnet flux near the coils when the flux ring of sufficient length and thickness is added. The overall magnet flux is not appreciably increased, but rather directed outward further from the magnet by the addition of the ring. This was confirmed by search coil measurement of total flux in the magnet with and without the flux ring. Also, computer models of the mini gauge cross-section confirms this test result.

FIG. 2 shows an electrically conductive cylindrical damping ring 36 used in the present invention. It is only possible to consider magnetic damping in the air-core gauge when the magnet flux is very high. Table 1 shows that the flux level of the mini gauge is 3.5 times that of the prior art when containing a plastic molded neodymium magnet. Other prior art gauges produce even lower flux levels pushing this ratio from 3.5:1.0 as high as 7.0:1.0.

Figure 7:
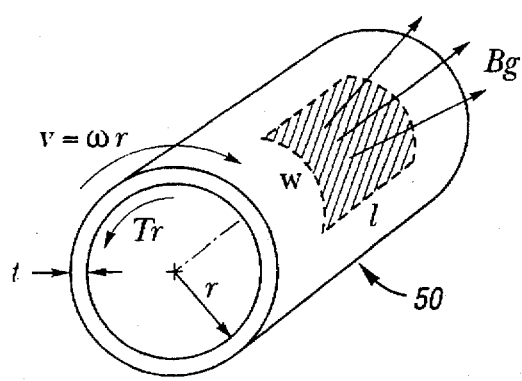
FIG. 7 is a perspective view of a circular cross-section flux ring.

With reference to FIG. 7, the following expression defines magnetic damping torque as a function of several parameters, including the flux density through the conductive damping ring.

$$T_r = K_1 l^2 B_g^2 V r w t / p \quad *$$

where: $T_r$=cylinder retarding or eddy current braking torque.

l=length of braking magnetic field parallel to the axis of the cylinder.

$B_g$=flux density in the air gap due to magnetic field from permanent magnet normal to the surface of the cylinder.

V=ωr=tangential velocity of the rotating magnetic flux.

r=effective torque radius.

w=width of braking magnetic field perpendicular to axis of cylinder.

t=thickness of the cylinder.

p=electrical resistivity of cylinder.

$K_1$=proportionality constant.

* Basic Equation is from U.S. Pat. No. 4,238,729 adapted to a cylinder.

It can be seen that the damping torque is proportional to the square of this flux density and the square of the magnet length times the magnet radius. Since, the mini gauge has 3.5 to 7.0 times the flux level as prior art air-core gauges and the length increase offsets most of the diameter decrease, damping torque capability of the mini gauge is approximately 6 to 24 times that of prior art air-core gauges. This fact makes magnetic damping a viable option in the new mini-gauge and leaves fluid damping the only real possibility in prior art air-core gauges.

The magnetic damping used in the mini gauge can be easily realized by putting a conductive material between the rotating magnet and the flux ring. As the magnet moves, a torque opposing it's motion is generated in the damping ring and the magnet motion is stabilized under transient torque conditions. The magnetic damping provides obvious advantages over liquid viscous damping currently used in prior art gauges. Filling the bobbin cavity with fluid is eliminated during production, the damping can not be lost in handling the gauge or during the use of the gauge. Finally, the entire gauge bobbin can be spun at high speed (because no fluid can be thrown out) to facilitate alternate methods of winding the gauge coils.

FIG. 3 shows a comparison of the gauge angular displacement in response to a step input in drive torque. With no damping, the gauge will "ring" at low frequency as shown by curve 52. With magnetic damping, the "ringing" is significantly reduced as shown by curve 54.

As has been shown, unlike prior art air-core gauges the mini gauge flux ring is a significant factor in the magnetic circuit. Because it can change flux levels at the coils by over 60%, it now can be considered as a variable reluctance device.

Figure 4A:
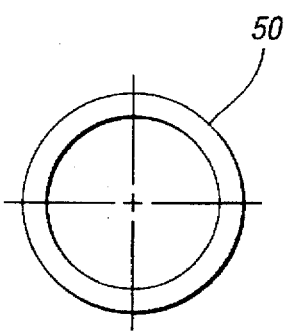
FIG. 4a is an axial end view of a circular flux ring.
Figure 5A:
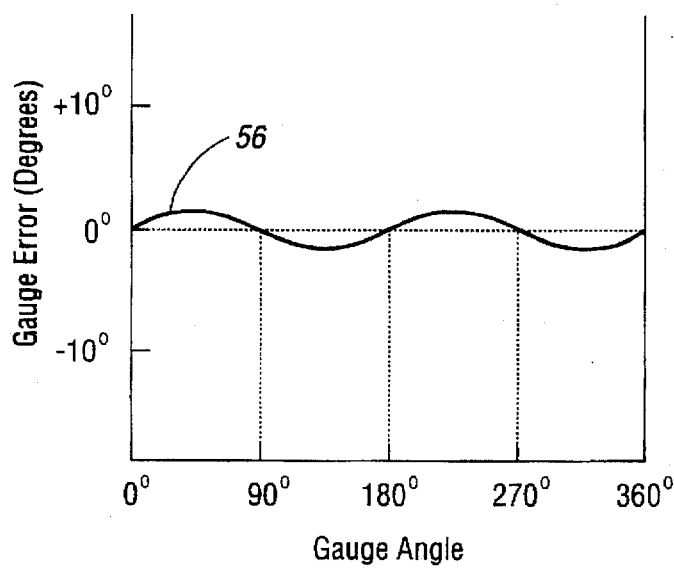
Figure 4B:
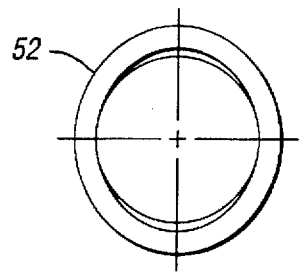
FIG. 4b is an axial end view of an oval flux ring.
Figure 5B:
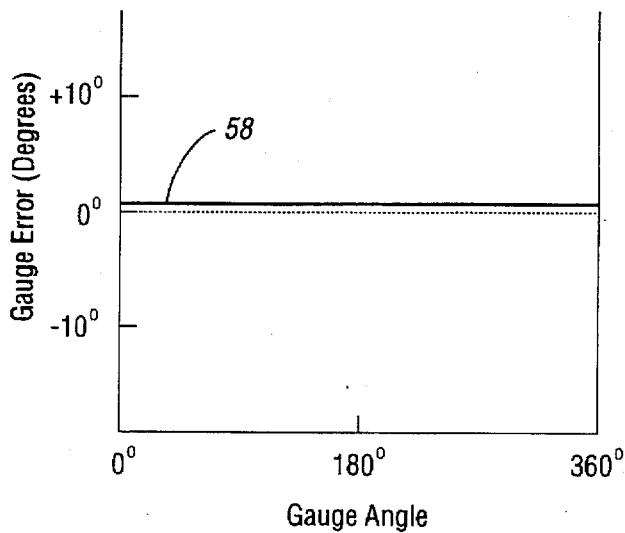
FIG. 5b is a graph illustrating gauge error as a function of gauge angle for an oval flux ring illustrated in FIG. 4b.
Figure 4C:
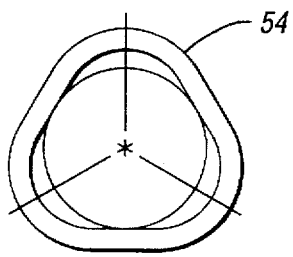
FIG. 4c is an axial end view of a Tri-bump flux ring.
Figure 5C:
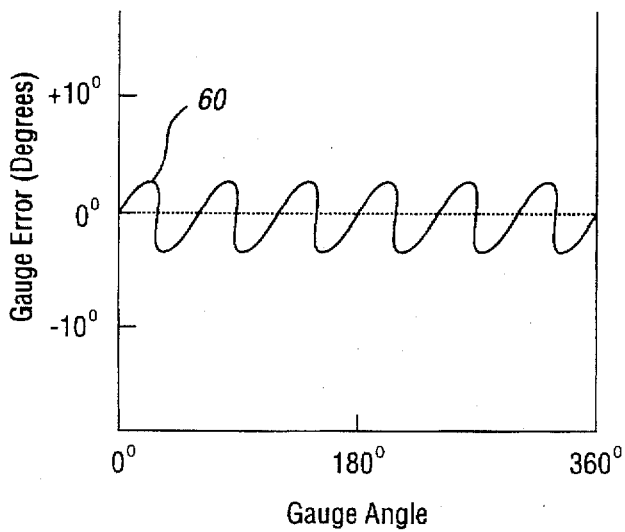
FIG. 5c is a graph illustrating gauge error as a function of gauge angle for a Tri-bump flux ring shown in FIG. 4c.

FIGS. 4a, 4b, and 4c illustrate three different flux rings 50, 52, and 54 of different configurations starting with the standard circular flux ring 50 in FIG. 4a. FIGS. 5a, 5b and 5c provide graphs showing gauge angular position error as a function of gauge angle for each flux ring. This error results from static torque variations as the gauge magnet rotates through 360 degrees. In the circular flux ring case, the gauge error curve 56 has four humps of about 3 to 5 degrees error caused by the outside gauge coil being of a lesser influence on the magnet than the inside coil. This is because for an equal number of turns the outside coil has higher resistance and is spaced further away from the magnet than the inside coil.

The oval flux ring 52 of FIGS. 4b and 5b provides a method to compensate the nonlinear result from the first case. The reluctance of the gauge magnetics can be adjusted by rotating the oval flux ring relative to the coil bobbin in such a manner as to balance the unequal coil torques. The reluctance torque offsets the torque produced by the coil imbalance such that the gauge position error can be reduced as shown by curve 58 in FIG. 5b.

The third flux ring design shown in FIGS. 4c and 5c is a tri-bump design illustrating how the magnetic reluctance torque of the gauge can be further modified to produce a simple stepping action from the gauge. In this case a tri-bump flux ring 54 is used. With a two-pole magnet, six torque bumps can be produced in the gauge as shown by curve 60 in FIG. 5c. The mini gauge magnet will preferentially align at six different locations providing a form of memory that will hold the gauge position similar to a stepper motor. Of course, many variations of this idea can be envisioned producing different numbers of steps. Any modification of the flux ring to change the reluctance as a function of gauge angle could also be used (i.e., holes or thin walls).

Figure 6:
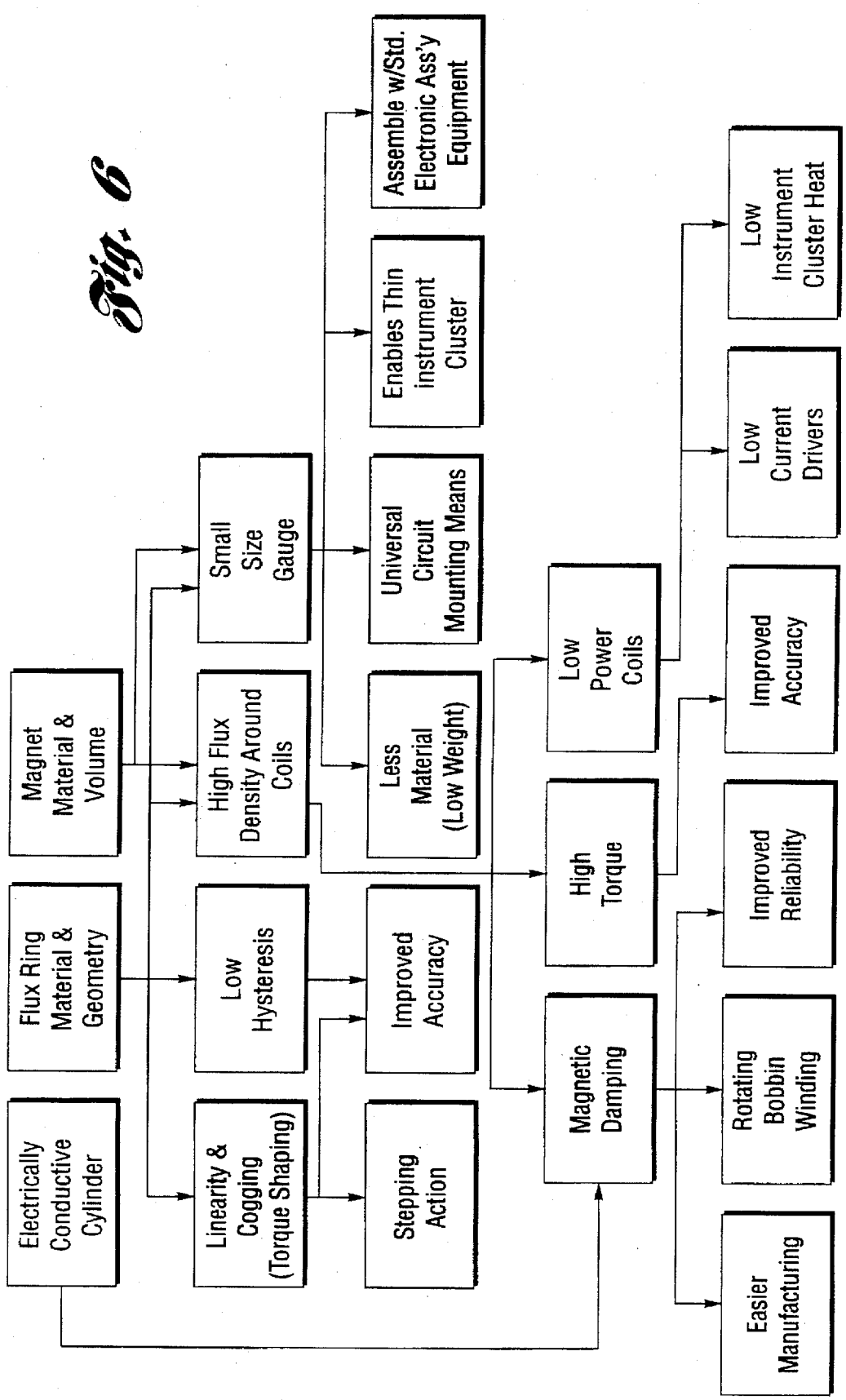
FIG. 6 is a block diagram showing how various positive features are enabled by the combination of three basic component technologies.

FIG. 6 is a relational block diagram that shows how the unique combinations of the flux ring, conductive cylinder, and magnet provide enabling technology. This results in a very small new aircore gauge called the mini gauge. It has several unique features that enable many other benefits as shown on this chart. These benefits all result from the small physical size of the gauge and the very high flux densities generated at the gauge coils. The flux ring itself becomes much more than a shield against external magnetic fields and is an active element in the system that can be modified to directly effect gauge characteristics.

FIGS. 8–15 illustrate a second embodiment of the invention earlier referred to as crossed coil gauge 62. The second embodiment of the invention is substantially similar to the first embodiment of the invention shown by crossed coil gauge 30. Crossed coil gauge 62 is shown with additional features that further improve its accuracy and repeatability from gauge to gauge.

Figure 8:
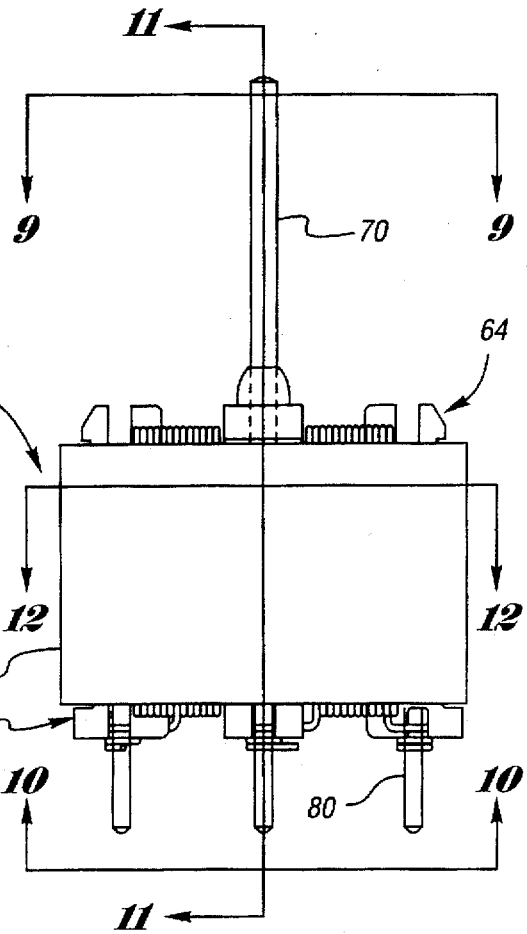
FIG. 8 is a side elevational view of a second embodiment of the invention.
Figure 9:
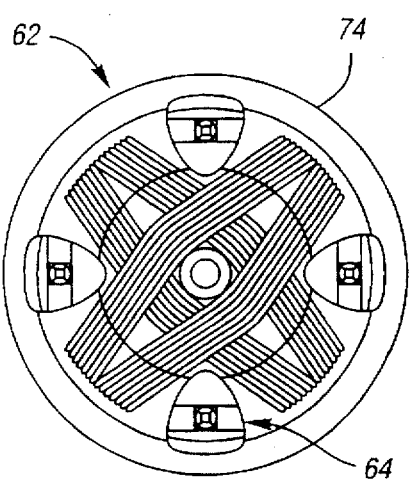
FIG. 9 is a front end view taken along line 9—9 of FIG. 8.
Figure 10:
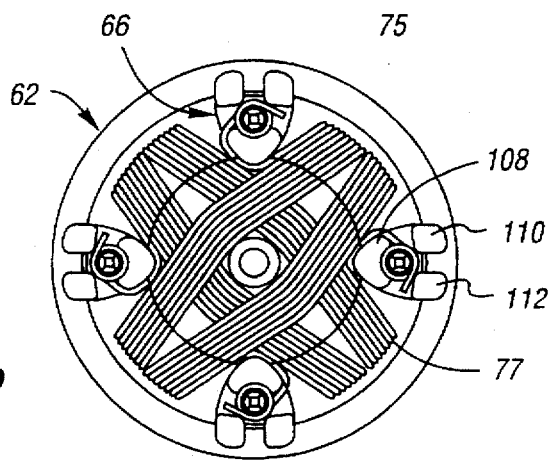
FIG. 10 is a rear end view taken along line 10—10 of FIG. 8.
Figure 11:
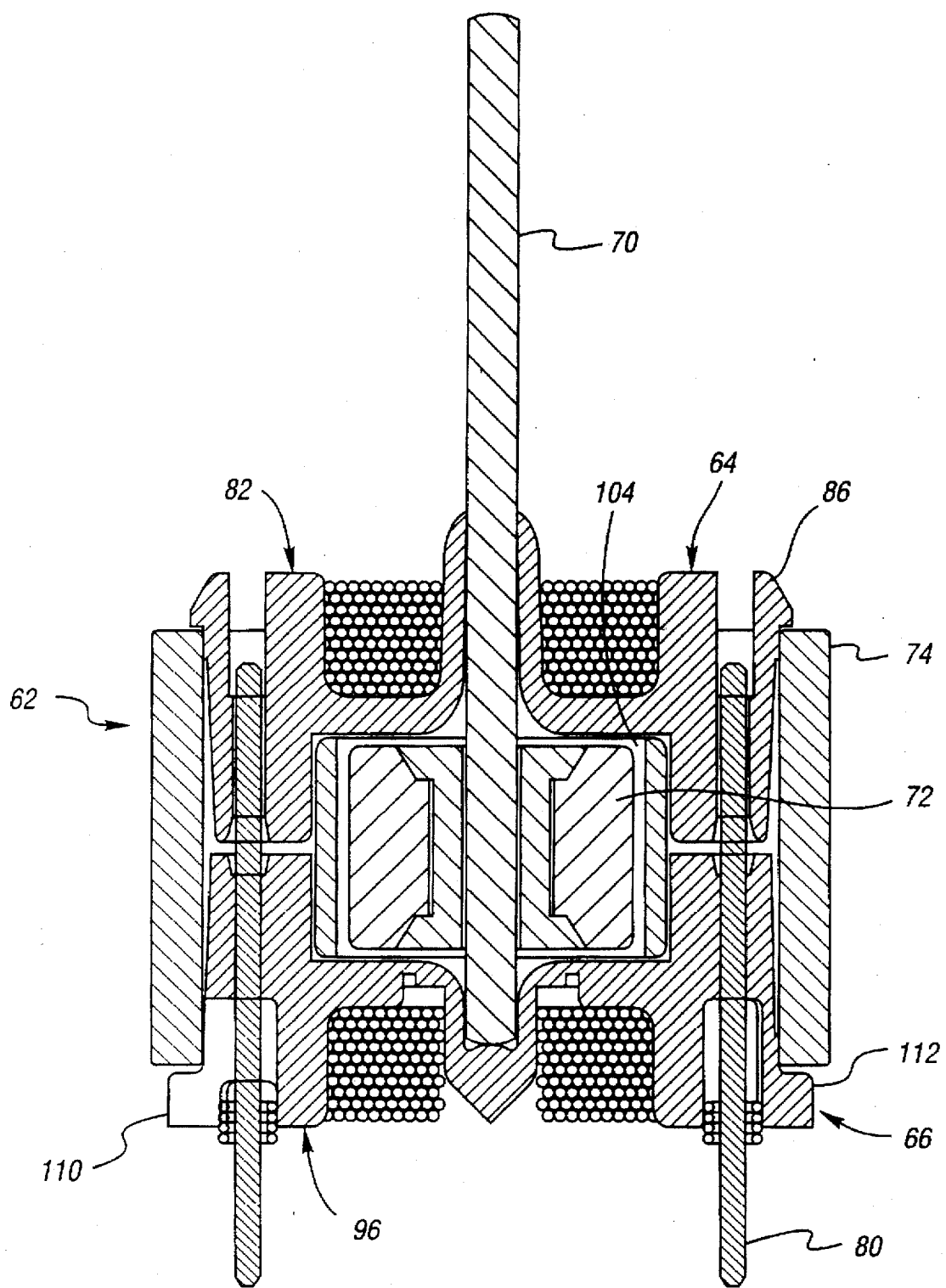
FIG. 11 is a cross-sectional side elevational view taken along line 11—11 of FIG. 8.
Figure 12:
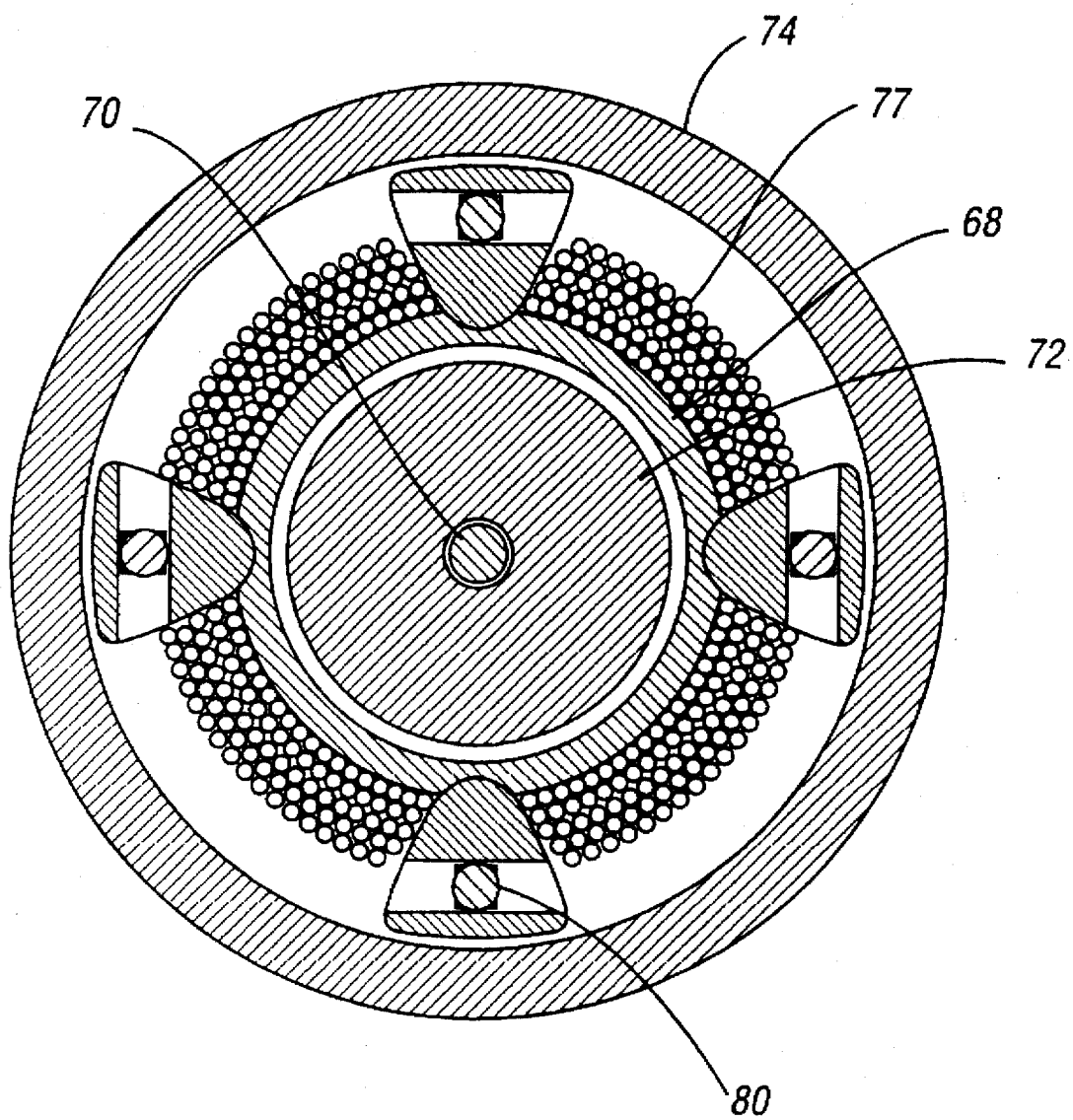
FIG. 12 is an axial end sectional view taken along line 12—12 of FIG. 8.
Figure 13:
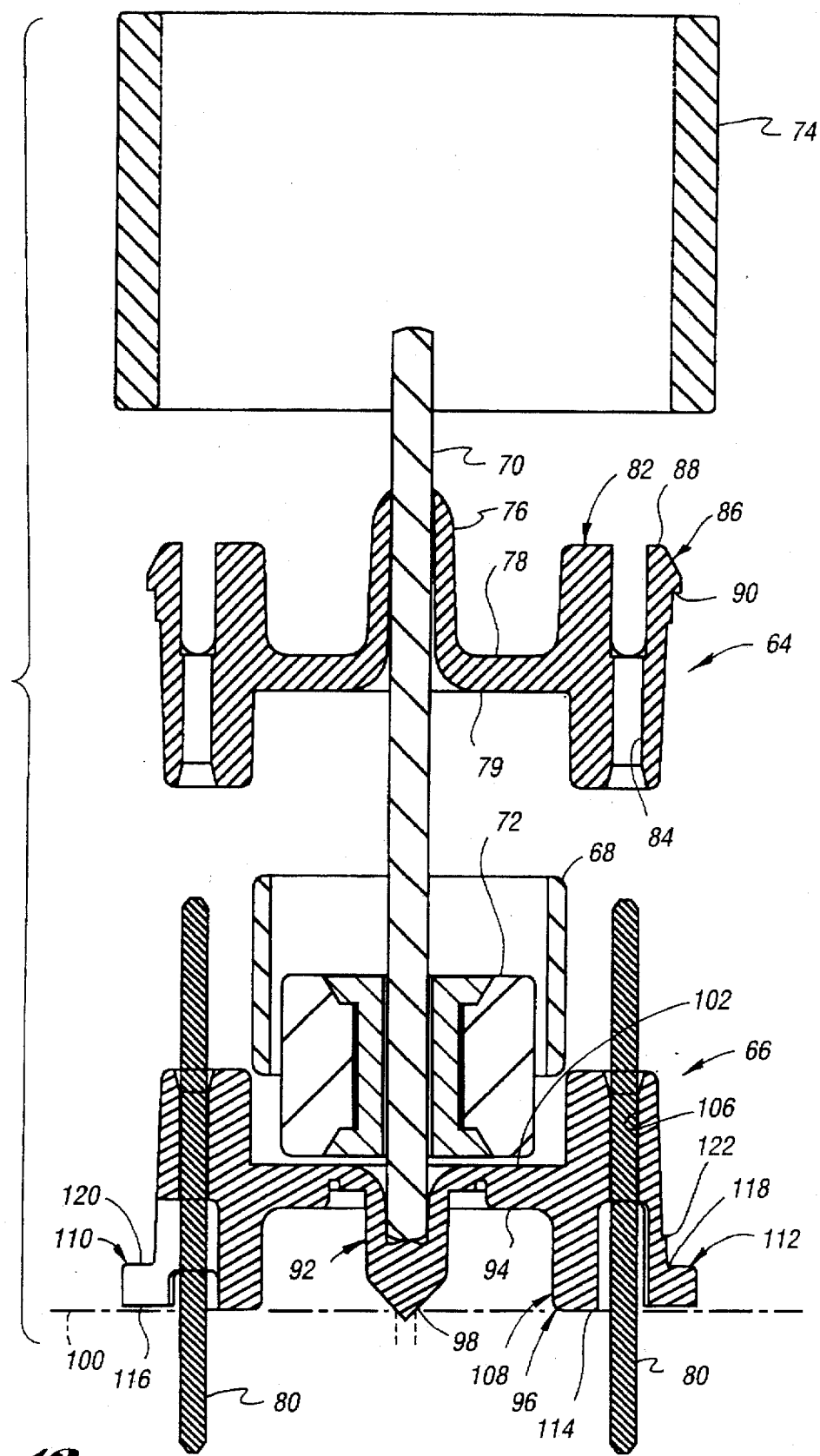
FIG. 13 is an exploded side cross-sectional elevational view of the second embodiment of the invention shown in FIG. 8.

Crossed coil gauge 62 is shown assembled in FIGS. 8–10. Longitudinal and radial cross-section of crossed coil gauge 62 is shown in FIGS. 11 and 12. For simplicity purposes, FIG. 13 shows an exploded cross-sectional view of crossed coil gauge 62 without the first and second coils.

Gauge 62 is made up of upper and lower bobbin 64 and 66. Interposed between upper and lower bobbins 64 and 66 is a cylindrical damping ring 68. Pivotally mounted on the upper and lower bobbins is gauge shaft 70 which supports cylindrical magnet 72. A flux ring 74 is provided which surrounds the upper and lower bobbin assembly in axial alignment with magnet 72. A pair of coils, first coil 75 and second coil 77, are wound about the bobbin assembly prior to the installation of the flux ring. The wire ends of the wires forming first and second coils 75 and 77 are each attached to one of four terminal pins 80.

In the embodiments of the invention illustrated in this application, the crossed coil gauges are intended to be mounted directly upon a circuit board without additional mounting devices or electrical connectors. While it should be appreciated that alternative forms of mounting can be utilized, the direct circuit board mounting is particularly advantageous due to low installation costs which are now achievable due to the very low mass of the present invention. Terminal pins 80 serve as the electrical conductors coupling the first and second coils to the gauge drive circuitry, and to physically mount the crossed coil gauge assembly on to a circuit board without any additional electrical or supporting means. Again, due to the extremely small gauge axial height, the gauge can be mounted on the front surface of the circuit board which would face the vehicle driver in an automobile instrument cluster application.

In the embodiment illustrated, the elongated portion of shaft 70 projects from the gauge assembly from what is referred to as the "upper" end of the gauge, while terminal pins 80 extend from the gauge assembly "lower" or opposite axial end. Of course, a wide variety of orientations and configurations can be utilized, the illustrated configuration is believed to be particularly suitable for automobile instrument clusters. While the gauge in actual use can be oriented in any position, for reference purposes, the gauge shown in FIGS. 8 and 11, side elevations show the gauge in an orientation with shaft 70 vertical. With reference to this orientation, bobbin 64 is referred to as the upper bobbin and bobbin 66 is referred to as the lower bobbin. The end of the gauge assembly from which shaft 70 projects is the upper end, and the end of the gauge assembly from which terminal pins 80 project is the lower end.

Upper bobbin 64 is a molded plastic part having a central hub 76 with a generally cylindrical bore formed therein for pivotally cooperating with shaft 70. Extending radially outward from central hub 76 is a generally disk shaped flange 78 having a generally planar and lower surface 79. At the outer periphery of disk shaped flange 78, there are four circumferentially spaced apart bosses, each having an elongated central aperture 84 for cooperating with terminal pin 80. Each boss 82 is also provided with a flexible latching member 86 which is inwardly radially biasable to facilitate the installation of flux ring 74 thereover. Latching member 86 is provided with an upper ramp surface 88 for engaging flux ring 74 and a stepped shoulder 90 for capturing the flux ring and maintaining the flux ring at a specified axial orientation relative to the gauge assembly. Preferably, upper bobbin 64 as well as lower bobbin 66 are injection molded using a nylon 66 material filled with 20% Teflon. This material has exhibited excellent stability and low friction characteristics.

Lower bobbin 66 is similarly provided with a central hub 92, a generally disk shaped radial flange 94, and four circumferentially spaced apart bosses 96. In the embodiment illustrated, central hub 94 is provided with a blind cylindrical cavity having an integrally formed central pivot point for pivotably cooperating with the lower end of shaft 70. The lower most external portion of hub 92 is formed by a downwardly inwardly tapered frusto-conical pilot surface 98 which extends below the plane of mounting surface 100 to facilitate the precise orientation of the gauge assembly on a circuit board during an automatic assembly process.

Flange 94 of lower bobbin 66 is provided with a generally planar upper surface 102 for cooperation with damping ring 68. When assembled, damping ring 68 engages planar surface 79 on upper bobbin 64 and planar surface 102 on lower bobbin 66 to define a sealed generally cylindrical magnet cavity 104. Damping ring 68 serves to space upper and lower bobbins apart as shown in FIG. 11.

Each boss 96 on lower bobbin 66 has a longitudinally extended bore 106 formed therein. Bores 106 are sized to receive terminal pins 80 which are press fit therein. Terminal pins 80 extend both above and below bosses 96 as illustrated. The portion extending above the boss cooperates with bore 84 in the upper bobbin boss to rotationally align the boss and retain the upper and lower bobbins prior to coil winding. Terminal pins 80 also extend below bosses 96 to facilitate the surface mounting of gauge assembly 62 on a printed circuit board.

Upper and lower bobbins 64 and 66 have a number of subtle design features to facilitate assembly. Flange members 78 and 94 are generally circular as indicated in FIGS. 9 and 10. The outside diameter of flange members 78 and 94 are preferably greater than damping ring 68 so that coils 75 and 77 which are wound about the upper and lower bobbin assembly do not contact damping ring 68. This minimizes the likelihood of shorting the coil out on the damping ring. Another feature which aids assembly is the construction of bosses 82 and 96. The radially innermost portion of bosses 82 and 96 extend inboard of the outer periphery of flange members 86 and 94 to prevent nesting of like parts when these parts are located together in any container. This feature eliminates an entanglement problem during gauge assembly.

As illustrated in FIGS. 10, 11, 13, and 15 the lower most portion of each of the bosses 96 is defined by three feet: fixed inboard foot 108, fixed outboard foot 110, and flexible outboard foot 112. Two fixed feet 108 and 110 are each provided with a generally planar flat molded surface 114 and 116 for cooperation with planar mounting surface 100. Flexible outboard foot 112 is slightly shorter as illustrated in FIG. 13 in order to enable the foot to freely flex radially inward without binding on the circuit board. The upper surface 118 and 120 of feet 112 and 110 are respectively spaced from the circuit board to provide a shoulder for cooperating with one axial end of flux ring 74. Flux ring 74 is precisely centered concentrically relative to the axis of shaft 70 by flexible feet 112 formed on each of the four circumferentially spaced apart bosses 96. Flexible feet 112 have an engagement surface 122 which is located at a radius relative to the shaft axis, slightly greater than the inner diameter of flux ring 74 so that each of the four feet will contact and coaxially align the flux ring 74 with shaft 70. The upper axial end of flux ring 74 is similarly coaxially aligned by latching members 86.

Flux ring concentricity and roundness are important factors since, as previously described, Both affect gauge linearity and gauge-to-gauge repeatability. The flexible mounting of the flux ring relative to the lower and upper bobbins enables the bobbin material to contract and expand with changes in temperature without deforming flux ring 74 or permanently deforming the bobbin.

Flux ring 74 is preferably formed of a 50/50 nickel/iron alloy having a low residual induction such as the material described in ASTM Standard A 904 dated 1991. In order to facilitate manufacturing, it has been found that the use of a powdered metal forming process is ideally suited for fabricating flux ring 74. This process allows high material utilization, excellent roundness, low fabrication and tooling costs, and enables the formation of uniform thick walled parts. The selected nickel iron powdered metal alloy is compacted to at least 7.0 g/cc and preferably at least 7.15 g/cc to achieve what is referred to as a fully dense preform. Once centered the resulting flux ring will have a density of at least 7.2 g/cc and preferably at least 7.4 g/cc.

Currently, the flux rings utilized with the prior art crossed coil gauges are formed using a drawing process. A typical flux ring of the prior art does not play a significant role in gauge performance, acting primarily as a shield, therefore tolerances are relatively unimportant. Furthermore, the geometry of prior art ring may not even be circumferentially uniform. Flux ring 74 of the present invention is cylindrical in shape having a circumferentially uniform cross-section. The inside diameter of flux ring 74 is approximately ½ inch, with preferably no more than 0.002 inches variation in roundness and preferably, less than 0.001 inches variation. To achieve roundness, flux ring 74 is sized with a sizing die after the initial sintering process. After the flux ring is sized, it is resintered in order to anneal the ring and eliminate any variances in magnetic properties within the flux ring. Flux ring 74 has an axial length of approximately 0.38 inches and a wall thickness of 0.045 inches. Flux ring 74 can vary in length, however, the length should not be less than the length of the magnet and the wall thickness should be sufficient to avoid magnetic saturation. Wall thickness ideally is greater than 8% of the flux ring length and preferably greater than 10% of the flux ring length.

As described with reference to the first gauge embodiment of flux ring 74, it plays a significant roll in the magnetic circuit connecting the north and south poles of magnet 72. The influence of the flux ring can be evaluated by measuring the flux using a hall probe sensor at the surface of the coils adjacent the magnet pole with both the flux ring in place with the flux ring removed. Preferably, the flux ring of the present invention will cause the peak flux measured at the coil surface with the probe sensor to increase at least 30% preferably over 50%.

In addition to making flux ring 74 utilizing a powder metal forming process, the flux ring can be formed using alternative methods which achieve a fully dense metal flux ring. The term "fully dense" is used herein refers to formed powder metal parts having 90% of the density of the pure metal alloy and preferably over 92% of the pure metal alloy density. These densities are obtainable in using the properly selected powder metals compressed to a relatively high level of compression. Higher densities approaching 100% can be achieved using a metal extrusion or metal injection molding process. The added increase in flux ring density however, may not be worth the added expense. Although it is believed that extruded or metal injection molded flux rings work quite satisfactorily, at the present time, flux rings formed of powder metal which are fully dense have a cost advantage. Of course, the flux ring can be formed using a conventional stamping process from a metal blank. However, due to the heavy wall thickness need for the present flux ring and the relatively small size, stamping is not believed to be economical due to the very high scrap rate and high cost of the raw material.

As previously described, magnet 72 is formed of a very high strength oriented rare earth magnet material. In particular, fully dense powder metal NdFeB and SmCo magnets perform satisfactorily. Selected magnet materials have an energy product over 25 MGO and preferably 28–60 MGO. It is believed that further advances in magnet technology which should increase magnet strength and reduce magnet cost will further increase the cost benefit comparison of the present invention versus gauges of the prior art construction.

The magnet 72 of the present invention has a diameter of 0.250 and an axial length 0.165. Ideally, the axial length of the magnet will exceed the magnet's radius. Most preferably, the magnet's axial length will be approximately 0.70 to 1.50 times the magnet's radius. Magnet 72 is magnetized in a manner so as to have two magnetic poles oriented radially 180° apart. Ideally, the magnet has a minimum strength of 3.0 Kilogauss, and most preferably, at least 4.0 Kilogauss measured at either pole on the magnet surface.

Magnet 72 is concentrically affixed to shaft 70 utilizing a conventional metal injection molding process using lead/tin alloy, a zinc alloy, a silver/tin alloy, or an antimony/tin alloy. When magnet 72 is NdFeB, it is preferably nickel coated using an electroplate process in order to minimize corrosion. To achieve good pull out strength, shaft 70 is knurled in the region of the magnet with a diamond or spiral knurl pattern. Magnet 72 has a hole formed there with annular recesses at each end to allow injection metal to be flush with the end faces of the magnet, thereby maximizing shaft push out strength. This method keeps the metal section material below the magnet face allowing room in the bobbin cavity for additional magnet material.

Damping ring 68 is designed to have an axial length greater than the magnet and an inside diameter greater than the magnet's diameter to define an enclosed cavity for the magnet to rotate within. Damping ring wall thickness effects the amount of damping. Wall thickness is between 0.018 to 0.040 inches, preferably above 0.020 inches. To avoid shorting of the coils, the damping ring is coated with an insulator such as Paralene™. Damping ring 68 is formed of annealed electrically pure OFHC copper (oxygen-free high conductivity), however, other non-magnetic electrically conductive materials, such as aluminum can be used provided they exhibit the requisite eddy current damping characteristics.

Once the magnet, shaft, damping ring and bobbins are assembled, the subassembly is placed in a coil winder for winding first and second coils 75 and 77. Coils 75 and 77 are wound using conventional copper magnet wire. Wire gauge is preferably 38 to 50 gauge, and most preferably 44 gauge. Ideally, approximately 500–1000 turns, and preferably about 800 turns, are wound in each coil. As noted with reference to FIG. 5a, a non-linearity results from the increase in resistance in the outer most of the two coils due to the added wire length for a given number of turns. In order to maintain the resistance and the number of amp turns equal, a compensation resistor or additional back-wound turns can be added to the innermost coil. Back winding increases the inner coil resistance while maintaining the proper net number of amp turns.

An alternative method of winding the coils to achieve equal amp turns and resistance involves varying wire winding tension. The innermost coil is wound in a conventional manner except that the tension on the wire during winding is adjusted to stretch the wire and increase the resistance. The outer coil is then wound at the normal tension. Small changes in wire tension when using fine wire can cause significant changes in coil resistance. This method is made practical by the small size of the coils resulting from the relatively few number of turns and the thin wire used in the present gauge. There is less than 10% difference in resistance between the coils when the coils are formed of 800 turns of 44 gauge wire with normal tensioning. This relatively small difference in resistance is very significant compared to the prior art which uses a much heavier wire and 2–4 times the number of turns. An alternative means for balancing the resistance and the net number of amp turns is the use of a calibration resistor in series with the first coil to appropriately increase its resistance, thus reducing its amp turns.

Figure 14:
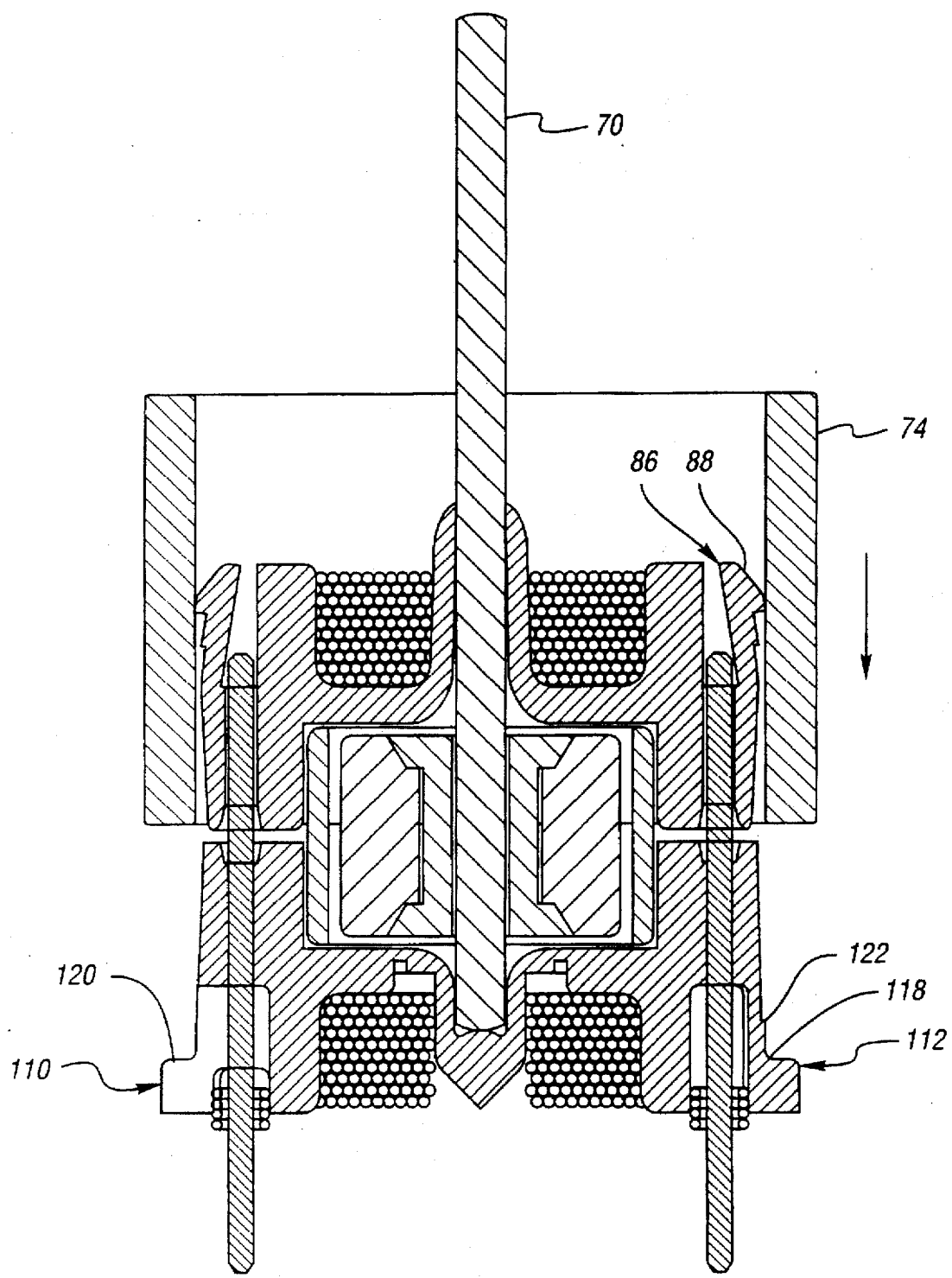
FIG. 14 is a cross-sectional side elevational view of the second embodiment of the invention shown in FIG. 8 during the flux ring installation process.

Once the coils are wound, the wire ends forming the coils are terminated on terminal pins 80. Feet 108, 110 and 112 are spaced about the terminal pins a distance sufficient to form a pocket into which the wound wire ends may recess enabling the gauge assembly to be flush mounted on to a circuit board. Once the coils are wound and terminated, flux ring 74 can be axially installed over the upper bobbin as shown in FIG. 14. Latch members 86 flex radially inward as illustrated enabling the flux ring to pass thereover.

Figure 15:
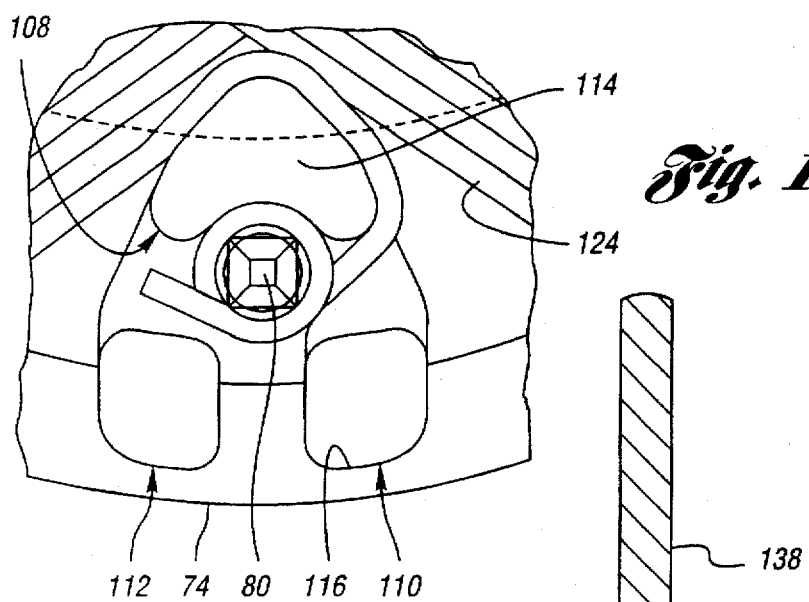
FIG. 15 is an enlarged rear end view of the second embodiment of the invention showing a detail of the wire connection.

An enlarged detail of the foot design of the lower bobbin is shown in FIG. 15. Fixed inner foot 108 has a smooth round contour to enable wire 124 to wrap thereabout providing a strain relief for the wire.

Figure 16:
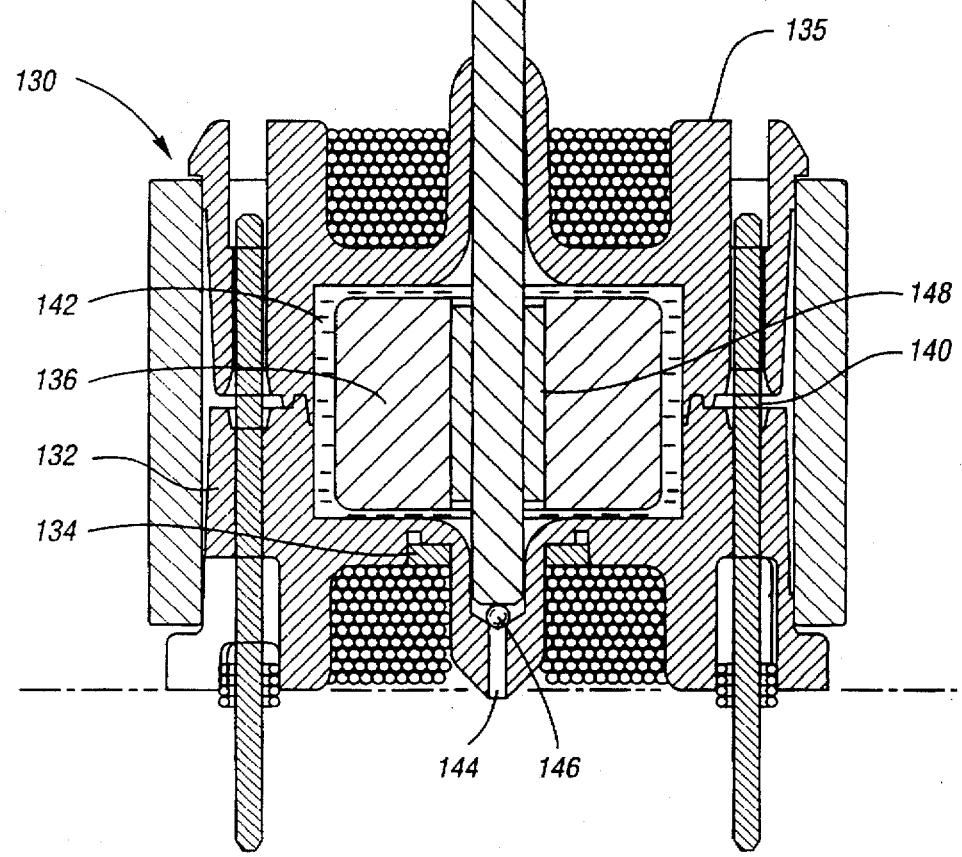
FIG. 16 is a side elevation view of a third gauge embodiment of the present invention.

A third gauge embodiment 130 is illustrated in FIG. 16. Gauge 130 differs from gauge 62 described previously in three ways: (i) the addition of magnetic biasing to axially orient the magnet and shaft relative to the bobbin; (ii) the absence of a damping ring and the use of a ferrofluid magnetic damping fluid; and (iii) the method of affixing the magnet and shaft.

Lower bobbin 132 is provided with a thrust disk 134 which serves to magnetically cooperate with the magnet 136 and associated shaft 138. Thrust disk 134 is a flat washer made of a fully annealed nickel/iron alloy which is approximately 0.015 inches thick having a 0.160 outside diameter and a 0.080 inside diameter. Thrust disk 134 serves to bias magnet 136 downward to maintain the lower end of shaft 138 securely engaged within the lower bobbin 132. This construction enables the gauge to be used in any angular orientation and in high vibration environments while preventing the magnet from contacting the upper bobbin.

Gauge 130 does not utilize eddy current damping. Rather, lower bobbin 132 and upper bobbin 135 sealingly engage one another to define an enclosed magnet cavity 140. Once the gauge is substantially complete and the first and second coils have been wound about the bobbin, a ferrofluid 142 is injected into magnet cavity 140. The ferrofluid serves to at least partially fill the region of the magnet cavity 140 and spanning the radial gap between the outer periphery of magnet 136 and the upper and lower bobbin. Ferrofluid 142 is injected into the magnet cavity 140 via a bore 144 formed in lower bobbin 132. A ball bearing 146 shown in FIG. 16 and in enlarged view in FIG. 17 serves to seal bore 144 and provide a bearing surface engaging the end of shaft 138. As described in the preceding paragraph, thrust disk 134 serves to axially bias the magnet 136 and attract shaft 138 downwardly. This downward biasing force causes the shaft to engage ball bearing 146 and seal bore 144. The ball 146 serves as a thrust bearing and a check valve enabling the ferrofluid 142 to be injected subsequent to coil winding.

The advantage of ferrofluids as opposed to non-magnetic damping liquids is that the fluid is attracted to the outer periphery of magnet 136. This prevents the fluid from leaking out and enables the gauge to be manufactured with small amounts of fluid. As little as 0.02–0.05 ml of fluid and preferably about 0.03 ml of ferrofluid is used to provide damping. The selected ferrofluid should have a viscosity measured at 27° C. of 1,000–50,000 Centipoise preferably 5,000–20,000 Centipoise. Additionally, the selected ferrofluid should have a relatively low saturation magnetization. Fluids having a saturation magnetization of 200 gauss measured at 25° C. have proven to work satisfactorily. Preferably, the selected ferrofluid will have a saturation magnetization at or below 200 gauss, preferably in the 100–200 gauss range. Ferrofluids meeting the above criteria are available from Ferrofluidics Corporation, 40 Simon Street, Nashua, N.H. Ferrofluids are generally described in a booklet published by Ferrofluidics Corporation entitled "Ferrofluids: Physical Properties and Applications", © 1986, which is incorporated by reference herein.

Magnet 136 is affixed to shaft 138 utilizing a mechanically deformed ferrule 148. Magnet 136 is provided with a central axial bore which is approximately two times the shaft diameter. Ferrule 148 is sized to slip-fit over shaft 138 and into the axial bore in magnet 136. The shaft and magnet are then positioned relative to one another in precise coaxial alignment in an installation fixture and the ferrule 148 is axially compressed. The ferrule is plastically deformed to cause the shaft and magnet to be securely affixed to one another. To further enhance the joint strength, the outer periphery of shaft 138 is knurled as previously described with reference to the second embodiment. Ferrule 148 can be formed of a tin/silver or tin/antimony alloy, however, it is believed that zinc, copper, aluminum, or lead/tin alloys would likewise perform satisfactorily.

Figure 17:
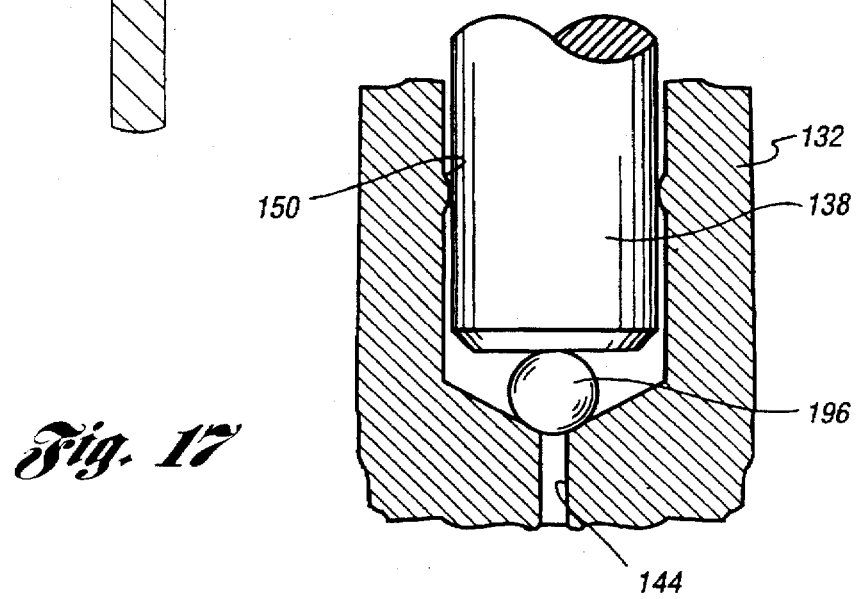
FIG. 17 is an enlarged portion of the third gauge embodiment.

An additional design detail illustrated in FIGS. 16 and 17 is ring 150 formed in lower bobbin 132 and upper bobbin 135 for the purposes of limiting the frictional side wall contact area between bobbins 132 and 135 and shaft 138. By limiting the contact area of the bobbins 132 and 135 which engage shaft 138, friction and the associated hysteresis can be minimized.

Figure 18:
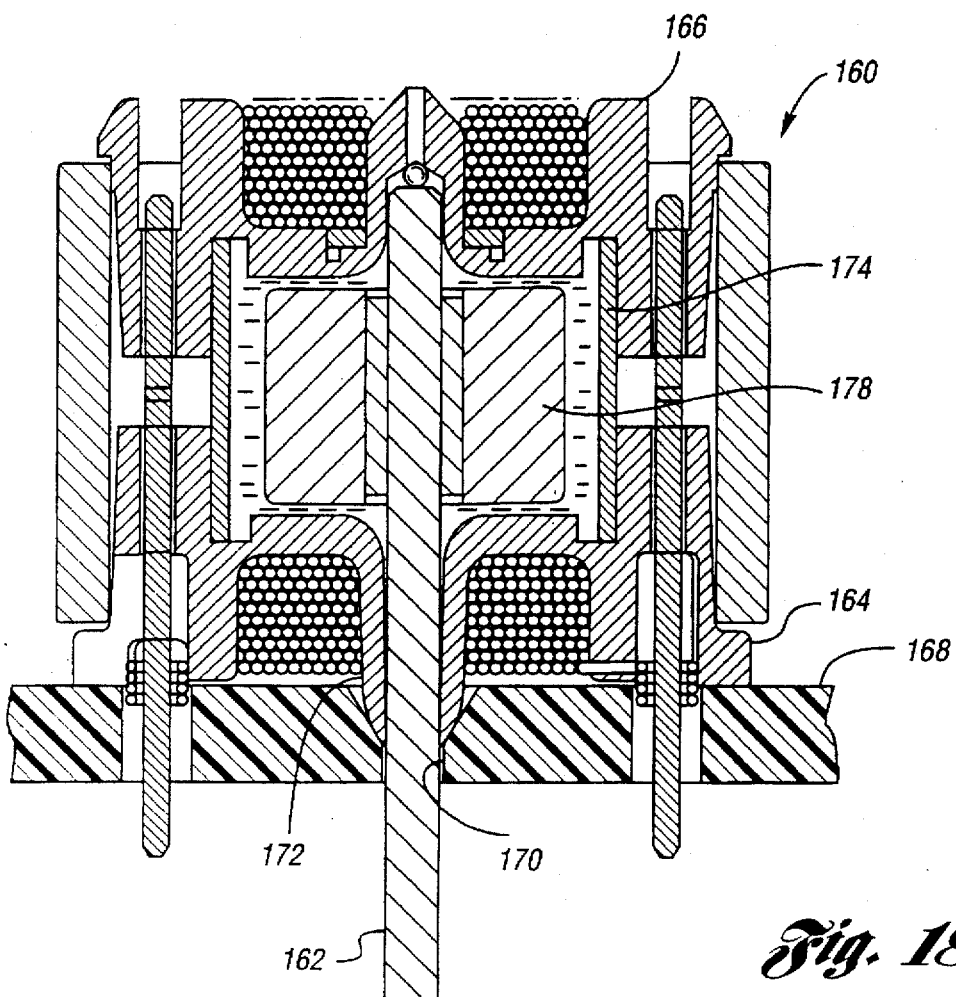
FIG. 18 is a cross-sectional side elevational view of a fourth embodiment of the invention.

The fourth gauge embodiment 160 is shown in FIG. 18. Gauge 160 is similar to gauge 130 however, shaft 162 projects out of lower bobbin 164 rather than upper bobbin 166. This alternative construction facilitates the mounting of gauge 160 on what is frequently referred to as the rear side of the printed circuit board 168 with the shaft 162 projecting through an aperture 170 formed on the printed circuit board. As illustrated in FIG. 18 of 172, the lower bobbin 164 cooperates with a frusto-conical portion of aperture 172 precisely align gauge 160 and printed circuit board 168. This gauge orientation is typical of conventional cross-coil gauges used in automotive instrumentation. The disadvantage of this orientation however, is the difficulty in soldering the gauge to the printed circuit board using a wave solder machine as a result of the presence of shaft 162.

Figure 19:
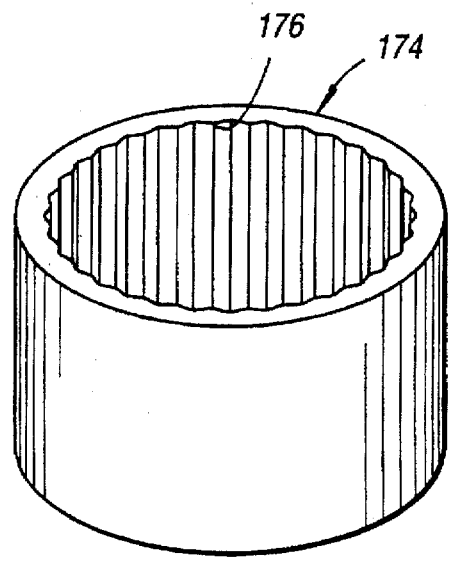
FIG. 19 is a perspective view of a bobbin spacer utilized in the fourth gauge embodiment.

Another difference between gauge 160 and the embodiments previously described is bobbin ring 174 shown enlarged in FIG. 19. Bobbin ring 174 serves to space upper and lower bobbins 166 and 164 apart and find therebetween in a closed magnet cavity. Bobbin ring 164 is one of a plastic material and is provided with a series of internal longitudinal ribs 176. Ribs 176 serve to enhance the damping forces caused by the ferrofluid which partially fills the magnet cavity and spans the radial gap between the outer periphery of magnet 178 and ribs 176. This ring can also facilitate different gauge lengths (magnets) without redesign or additional tools. The feature 176 of FIG. 19 can also be incorporated in FIG. 16 when a separate ring is not used.

Figure 20:
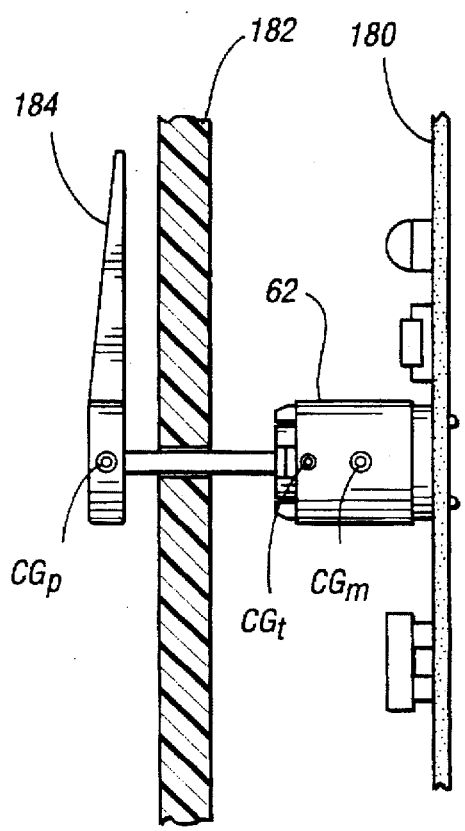
FIG. 20 is a side elevational view of the second gauge embodiment in a typical instrument cluster application.
Figure 21:
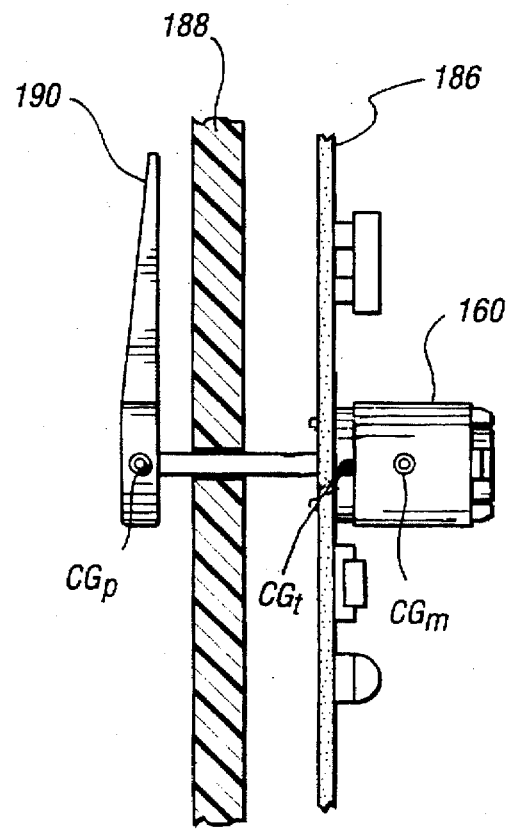
FIG. 21 is a side elevational view of the fourth gauge embodiment mounted in an automotive instrument cluster application.

FIGS. 20 and 21 illustrate the two gauge mounting orientations. FIG. 20 illustrates the orientation of gauge motor 62 as relative to printed circuit board 180 graphic and light distribution layer 182 and pointer 184. As shown, gauge motor 62 is mounted on the front side of printed circuit board 180 along with other conventional electrical components enabling the gauge motor to be wave soldered onto the printed circuit board. The very small size of gauge motor 62 of the present invention results in a small gauge footprint on a printed circuit board providing more space for electronic components. This additional space can result in a significant cost savings if the conductive plating on the printed circuit board be only applied to one side (i.e., one-sided board) as opposed to a more costly two-sided board. It should be further appreciated that the very small size of gauge motor 62 facilitates this mounting directly on the printed circuit board using the conductor pins as sole electrical connection and sole mechanical connection of the gauge on the board. As illustrated, the gauge motor center of gravity $CG_m$ is in close proximity to the PC board. The gauge motor center of gravity $CG_m$ is within 0.3 inches of the printed circuit board surface and preferably within 0.25 inches of the printed circuit board surface when the gauge motor is equipped with a worst case high mass pointer which has a center of gravity located at $CG_p$. Even a heavy pointer having a weight of 4 grams would maintain the center of gravity of the total assembly $CG_t$ within 0.5 inches from the printed circuit board surface. Gauges of this construction are provided with heavy pointers by industry standards and have survived extended vibration tests and have passed both mechanical and electrical gauge mounting requirements.

The fourth gauge embodiment is illustrated on a printed circuit board of a typical automotive instrumentation application in FIG. 21. Printed circuit board 186 has gauge 160 and a series of electrical components mounted on the backside. The gauge shaft extends through the printed circuit board and through the graphic and light distribution layer 188 to support pointer 190 as shown. An advantage of this construction is the location of the center of gravity of the total assembly $CG_t$ relative to the printed circuit board 186. The center of gravity of the gauge motor $CG_m$ and the gauge pointer $CG_p$ spaced on opposite sides of the PC board 186 thus having to balance one another minimizing the bending load exerted on the motor printed circuit board connection resulting from vibratory loads.

Figure 22:
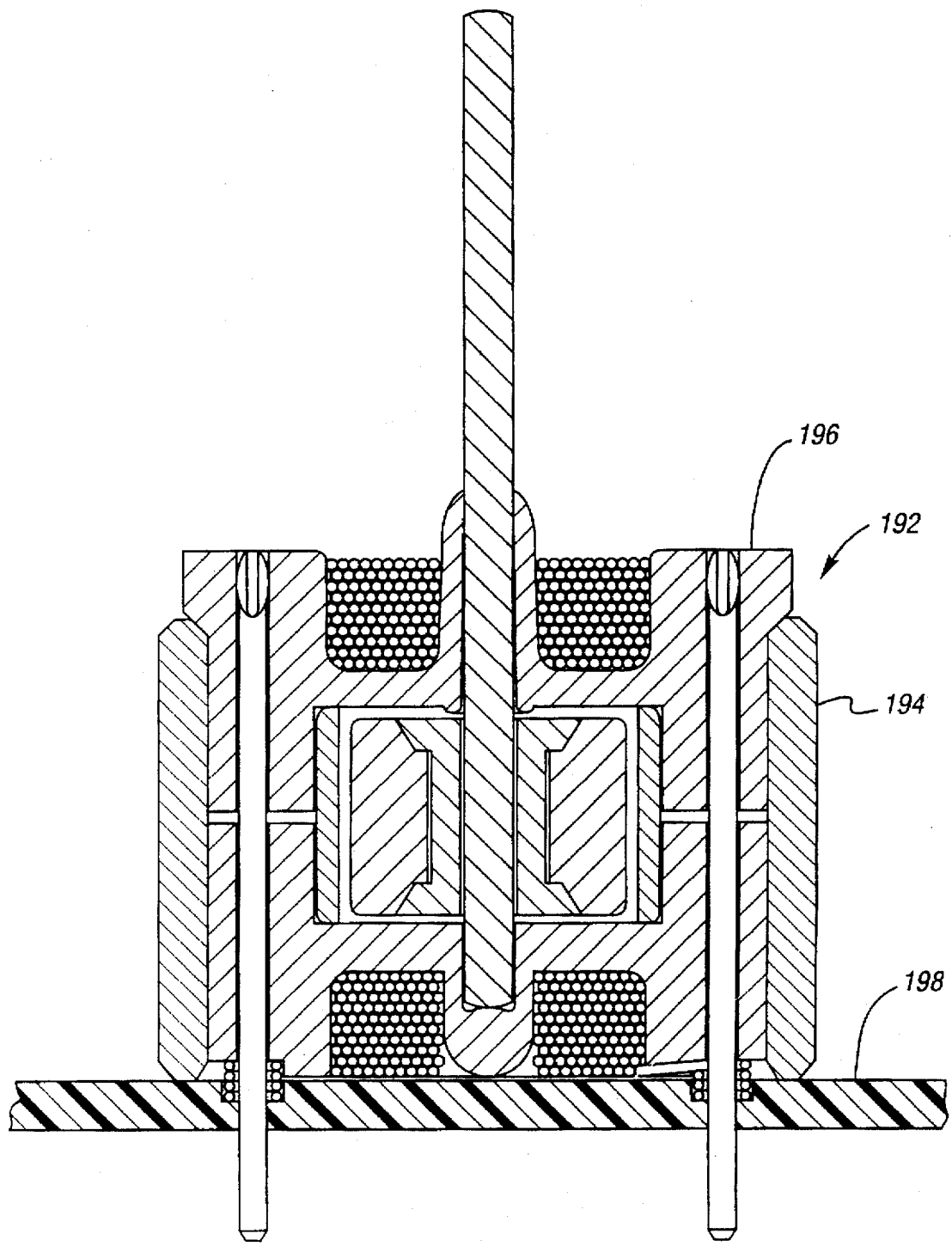
FIG. 22 is a cross-sectional side elevational view of a fifth gauge embodiment.

A fifth gauge embodiment of 192 is shown in FIG. 22. This gauge embodiment is generally similar to gauge 62 shown in FIG. 11. The primary difference being that flux ring 194 is trapped between shoulders on the upper bobbin 196 and printed circuit board 198.

It is also understood, of course, that while the form of the invention herein shown and described constitutes a preferred embodiment of the invention, it is not intended to illustrate all possible forms thereof. It should also be understood that the words used in the specification are words of description rather than limitation and various changes may be made without departing from the spirit and scope of the invention.

What is claimed is:

1. A crossed coil gauge comprising:
   a shaft oriented along a shaft axis;
   an oriented rare-earth magnet mounted to rotate with the shaft along the shaft axis, the magnet supplying magnetic flux directed transverse to the shaft axis, the magnet shaped as a circular cylinder having a radius and a length, wherein the length of the magnet exceeds the radius;
   a gauge housing which houses the magnet and the shaft, the gauge housing providing support for rotation of the shaft and the magnet about the shaft axis, the gauge housing including an upper bobbin, a lower bobbin, and a damping ring disposed around the magnet and retained between the upper bobbin and the lower bobbin, wherein the damping ring provides eddy-current generated damping in response to rotation of the magnet relative thereto;
   a first coil and a second coil each wound around the gauge housing, wherein the first coil is wound generally perpendicular to the second coil and wherein the first coil and the second coil encircle the damping ring; and
   a flux ring, disposed around the first coil and the second coil and axially aligned with respect to the magnet and the shaft, said magnet having sufficiently high strength and said flux ring being mounted in sufficiently close proximity to the first and second coils to redistribute the magnetic flux supplied by the magnet such that the magnetic flux density near the first coil and the second coil is increased by at least 60% in comparison to the magnetic flux density supplied by the magnet without the flux ring.

2. The crossed coil gauge of claim 1, wherein at least one of the upper bobbin and the lower bobbin has means for attaching to an electronic circuit board.

3. The crossed coil gauge of claim 1, wherein the damping ring is formed of copper.

4. The crossed coil gauge of claim 1, wherein the damping ring is formed of aluminum.

5. The crossed coil gauge of claim 1, further comprising a bearing attached to the lower bobbin which acts as a bearing for the thrusting force of the magnet and the shaft assembly.

6. The crossed coil gauge of claim 1, further comprising means for directly mounting the gauge on an electronic circuit board.

7. The crossed coil gauge of claim 1 wherein the flux ring increases the magnetic flux density near the first coil and the second coil by at least 67% in comparison to the magnetic flux density supplied by the magnet without the flux ring.

8. The crossed coil gauge of claim 1 wherein the flux ring is shaped to avoid magnetic saturation.

9. The crossed coil gauge of claim 1 wherein the flux ring is formed of low carbon steel.

10. The crossed coil gauge of claim 1 wherein the flux ring is formed of nickel alloy steel.

11. The crossed coil gauge of claim 1 wherein the flux ring has an annular shape.

12. The crossed coil gauge of claim 1 wherein the flux ring deviates from an annular shape and is oriented relative to the gauge housing so that a gauge position error caused by a torque imbalance in the first coil and the second coil is reduced.

13. The crossed coil gauge of claim 1 wherein the flux ring deviates pronouncedly from an annular shape so that the magnet preferentially aligns at a plurality of predetermined gauge angles.

14. The crossed coil gauge of claim 1 wherein the flux ring is shaped so that the magnet preferentially aligns at a plurality of predetermined gauge angles.

\* \* \* \* \*